United States Patent
Kang et al.

(10) Patent No.: US 9,996,285 B2
(45) Date of Patent: Jun. 12, 2018

(54) CYCLICALLY INTERLEAVED XOR ARRAY FOR ERROR RECOVERY

(71) Applicant: SK hynix Inc., Gyeonggi-do OT (KR)

(72) Inventors: Jingyu Kang, San Jose, CA (US); Chung-Li Wang, Fremont, CA (US); Cai Wang, San Jose, CA (US); Yibo Zhang, San Jose, CA (US)

(73) Assignee: SK Hynix Inc., Gyeonggi-do (KR)

( * ) Notice: Subject to any disclaimer, the term of this patent is extended or adjusted under 35 U.S.C. 154(b) by 0 days. days.

(21) Appl. No.: 15/346,103

(22) Filed: Nov. 8, 2016

(65) Prior Publication Data

US 2018/0129430 A1     May 10, 2018

(51) Int. Cl.
| | |
|---|---|
| *G06F 3/06* | (2006.01) |
| *G06F 11/10* | (2006.01) |
| *G11C 29/52* | (2006.01) |
| *H03M 13/13* | (2006.01) |
| *H03M 13/27* | (2006.01) |

(52) U.S. Cl.
CPC ............ *G06F 3/0619* (2013.01); *G06F 3/064* (2013.01); *G06F 3/0665* (2013.01); *G06F 3/0679* (2013.01); *G06F 11/1044* (2013.01); *G06F 11/1068* (2013.01); *G11C 29/52* (2013.01); *H03M 13/13* (2013.01); *H03M 13/2757* (2013.01)

(58) Field of Classification Search
CPC ...... G06F 3/0619; G06F 3/064; G06F 3/0665; G06F 3/0679; G06F 11/1044; G06F 11/1068; G11C 29/52; H03M 13/13; H03M 13/2757
See application file for complete search history.

(56) References Cited

U.S. PATENT DOCUMENTS

| | | | | |
|---|---|---|---|---|
| 9,176,812 | B1 * | 11/2015 | Northcott | G06F 11/1068 |
| 9,183,085 | B1 * | 11/2015 | Northcott | G06F 11/1068 |
| 9,632,870 | B2 * | 4/2017 | Bennett | G06F 11/108 |
| 9,727,414 | B2 * | 8/2017 | Cohen | G06F 11/1068 |
| 2008/0250270 | A1 * | 10/2008 | Bennett | G06F 11/1068 714/6.13 |
| 2011/0066793 | A1 * | 3/2011 | Burd | G06F 11/1028 711/103 |
| 2011/0126045 | A1 * | 5/2011 | Bennett | G06F 11/1068 714/6.22 |
| 2013/0073895 | A1 * | 3/2013 | Cohen | G06F 11/1068 714/6.2 |
| 2015/0161000 | A1 * | 6/2015 | Kim | G06F 11/108 714/6.24 |
| 2017/0199670 | A1 * | 7/2017 | Bennett | G06F 3/064 |

* cited by examiner

*Primary Examiner* — Kyle Vallecillo
(74) *Attorney, Agent, or Firm* — IP & T Group LLP

(57) ABSTRACT

Memory systems may include a memory storage including at least a first stripe and a second stripe, the first stripe including data pages corresponding to the first stripe and a first parity page suitable for storing a first XOR parity, and the second stripe including data pages corresponding to the second stripe and a second parity page suitable for storing a second XOR parity, the data pages and parity pages being stored over a plurality of memory dies, wherein each memory die includes a number of planes; and a controller suitable for cyclically interleaving the data pages corresponding to the first stripe and the data pages corresponding to the second stripe.

20 Claims, 8 Drawing Sheets

|  | | Die 0 | | Die 1 | | Die 2 | | | Die N-1 | |
|---|---|---|---|---|---|---|---|---|---|---|
|  | | Plane 0 | Plane 1 | Plane 0 | Plane 1 | Plane 0 | Plane 1 | | Plane 0 | Plane 1 |
| 500 → | Page i | D | D | D | D | D | D | ... | D | P |
| 502 → | Page i + 1 | D | D | D | D | D | D | ... | D | P |
| 504 → | Page i + 2 | D | D | D | D | D | D | ... | D | P |

|  | | Die 0 | | Die 1 | | Die 2 | | | Die N-1 | |
|---|---|---|---|---|---|---|---|---|---|---|
|  | | Plane 0 | Plane 1 | Plane 0 | Plane 1 | Plane 0 | Plane 1 | | Plane 0 | Plane 1 |
| 500 → | Page i | D | D | D | ER | D | D | ... | D | P |
| 502 → | Page i + 1 | D | D | D | D | D | D | ... | D | P |
| 504 → | Page i + 2 | D | D | D | D | D | D | ... | D | P |

|  | Die 0 | | | | Die 1 | | | | | Die N-1 | | | |
|---|---|---|---|---|---|---|---|---|---|---|---|---|---|
|  | PL0 | PL1 | PL2 | PL3 | PL0 | PL1 | PL2 | PL3 | | PL0 | PL1 | PL2 | PL3 |
| 800 → Page i | D1 | D2 | D3 | D4 | D1 | D2 | D3 | D4 | ... | D1 | D2 | D3 | P4 |
| 802 → Page i +1 | D4 | D1 | D2 | D3 | D4 | D1 | D2 | D3 | ... | D4 | D1 | D2 | P3 |
| 804 → Page i +2 | D3 | D4 | D1 | D2 | D3 | D4 | D1 | D2 | ... | D3 | D4 | D1 | P2 |
| 806 → Page i +3 | D2 | D3 | D4 | D1 | D2 | D3 | D4 | D1 | ... | D2 | D3 | D4 | P1 |

|  | Die 0 | | | | Die 1 | | | | | Die N-1 | | | |
|---|---|---|---|---|---|---|---|---|---|---|---|---|---|
|  | PL0 | PL1 | PL2 | PL3 | PL0 | PL1 | PL2 | PL3 | | PL0 | PL1 | PL2 | PL3 |
| 800 → Page i | D1 | D2 | D3 | D4 | D1 | D2 | D3 | D4 | ... | D1 | D2 | D3 | P4 |
| 802 → Page i +1 | D4 | D1 | D2 | D3 | D4 | D1 | D2 | D3 | ... | D4 | D1 | D2 | P3 |
| 804 → Page i +2 | D3 | D4 | D1 | D2 | D3 | D4 | D1 | D2 | ... | D3 | D4 | D1 | P2 |
| 806 → Page i +3 | D2 | D3 | D4 | D1 | D2 | D3 | D4 | D1 | ... | D2 | D3 | D4 | P1 |

|  | Die 0 | | | | Die 1 | | | | | Die N-1 | | | |
|---|---|---|---|---|---|---|---|---|---|---|---|---|---|
|  | PL0 | PL1 | PL2 | PL3 | PL0 | PL1 | PL2 | PL3 | | PL0 | PL1 | PL2 | PL3 |
| 800 → Page i | D1 | D2 | D3 | D4 | D1 | D2 | D3 | D4 | ... | D1 | D2 | D3 | P4 |
| 802 → Page i +1 | D4 | D1 | D2 | D3 | D4 | D1 | D2 | D3 | ... | D4 | D1 | D2 | P3 |
| 804 → Page i +2 | D3 | D4 | D1 | D2 | D3 | D4 | D1 | D2 | ... | D3 | D4 | D1 | P2 |
| 806 → Page i +3 | D2 | D3 | D4 | D1 | D2 | D3 | D4 | D1 | ... | D2 | D3 | D4 | P1 |

CYCLICALLY INTERLEAVED XOR ARRAY FOR ERROR RECOVERY

BACKGROUND

1. Field

Exemplary embodiments of the present disclosure relate to a memory system and an operating method thereof.

2. Description of the Related Art

The computer environment paradigm has shifted to ubiquitous computing systems that can be used anytime and anywhere. Due to this fact, the use of portable electronic devices such as mobile phones, digital cameras, and notebook computers has rapidly increased. These portable electronic devices generally use a memory system having memory devices, that is, a data storage device. The data storage device is used as a main memory device or an auxiliary memory device of the portable electronic devices.

Data storage devices using memory devices provide excellent stability, durability, high information access speed, and low power consumption, since they have no moving parts. Examples of data storage devices having such advantages include universal serial bus (USB) memory devices, memory cards having various interfaces, and solid state drives (SSD).

Data written in flash memory (e.g., NAND) is subject to read errors, the data is typically protected by error correcting codes. The error correcting codes may still fail in some cases. Thus, there exists a need for improved error correcting codes and processes for overcoming read errors.

SUMMARY

Aspects of the invention include memory systems. The memory systems may include a memory storage including at least a first stripe and a second stripe, the first stripe including data pages corresponding to the first stripe and a first parity page suitable for storing a first XOR parity, and the second stripe including data pages corresponding to the second stripe and a second parity page suitable for storing a second XOR parity, the data pages and parity pages being stored over a plurality of memory dies, wherein each memory die includes a number of planes; and a controller suitable for cyclically interleaving the data pages corresponding to the first stripe and the data pages corresponding to the second stripe.

Further aspects of the invention include methods. The methods may include storing data pages and parity pages over a plurality of memory dies of a memory storage, each memory die including a number of planes, associating data pages and a first parity page with a first stripe of the memory storage, associating data pages and a second parity page with a second stripe of the memory storage, cyclically interleaving the first parity page and data pages associated with the first stripe with the second parity page and data pages associated with the second stripe, taking a first XOR parity over the first stripe and storing the first XOR parity in the first parity page, and taking a second XOR parity over the second stripe and storing the second XOR parity in the second parity page.

Additional aspects of the invention include memory devices. The memory devices may include a memory storage including at least a first stripe and a second stripe, the first stripe including data pages corresponding to the first stripe and a first parity page configured to store a first XOR parity, and the second stripe including data pages corresponding to the second stripe and a second parity page configured to store a second XOR parity, the data pages and parity pages being stored over a plurality of memory dies, wherein each memory die includes a number of planes, and a controller configured to cyclically interleave the data pages corresponding to the first stripe and the data pages corresponding to the second stripe.

BRIEF DESCRIPTION OF THE DRAWINGS

FIG. 5 is a diagram of an example XOR configuration in accordance with aspects of the invention.

FIG. 6 is a diagram of an example XOR configuration with an error according to aspects of the invention.

FIG. 8A is a diagram of an example XOR configuration in accordance with aspects of the invention.

FIGS. 8B and 8C are diagrams of example XOR configurations with errors according to aspects of the invention.

DETAILED DESCRIPTION

Figure 1:
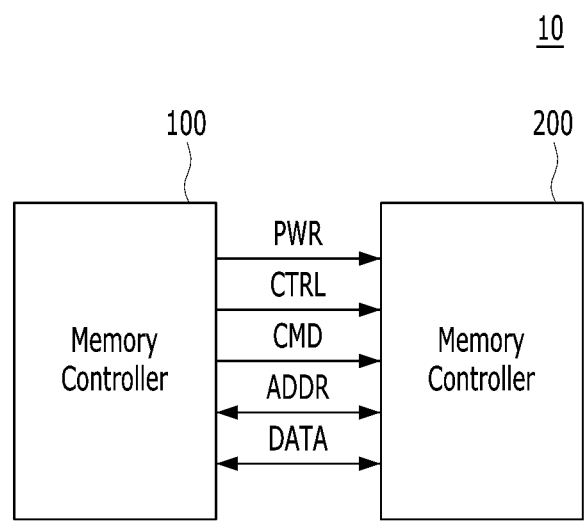
FIG. 1 is a block diagram schematically illustrating a memory system in accordance with an embodiment of the present invention.

Various embodiments will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

The invention can be implemented in numerous ways, including as a process; an apparatus; a system; a composition of matter; a computer program product embodied on a computer readable storage medium; and/or a processor, such as a processor suitable for executing instructions stored on and/or provided by a memory coupled to the processor. In this specification, these implementations, or any other form that the invention may take, may be referred to as techniques. In general, the order of the steps of disclosed processes may be altered within the scope of the invention. Unless stated otherwise, a component such as a processor or a memory described as being suitable for performing a task may be implemented as a general component that is temporarily suitable for performing the task at a given time or a specific component that is manufactured to perform the task. As used herein, the term 'processor' refers to one or more devices, circuits, and/or processing cores suitable for processing data, such as computer program instructions.

A detailed description of one or more embodiments of the invention is provided below along with accompanying figures that illustrate the principles of the invention. The invention is described in connection with such embodiments, but the invention is not limited to any embodiment. The scope of the invention is limited only by the claims and the invention encompasses numerous alternatives, modifications and equivalents. Numerous specific details are set forth in the following description in order to provide a thorough understanding of the invention. These details are provided for the purpose of example and the invention may be practiced according to the claims without some or all of these specific details. For the purpose of clarity, technical material that is known in the technical fields related to the invention has not been described in detail so that the invention is not unnecessarily obscured.

FIG. 1 is a block diagram schematically illustrating a memory system 10 in accordance with an embodiment of the present invention.

Referring FIG. 1, the memory system 10 may include a memory controller 100 and a semiconductor memory device 200.

The memory controller 100 may control overall operations of the semiconductor memory device 200.

The semiconductor memory device 200 may perform one or more erase, program, and read operations under the control of the memory controller 100. The semiconductor memory device 200 may receive a command CMD, an address ADDR and data DATA through input/output lines. The semiconductor memory device 200 may receive power PWR through a power line and a control signal CTRL through a control line. The control signal may include a command latch enable (CLE) signal, an address latch enable (ALE) signal, a chip enable (CE) signal, a write enable (WE) signal, a read enable (RE) signal, and so on.

The memory controller 100 and the semiconductor memory device 200 may be integrated in a single semiconductor device. For example, the memory controller 100 and the semiconductor memory device 200 may be integrated in a single semiconductor device such as a solid state drive (SSD). The solid state drive may include a storage device for storing data therein. When the semiconductor memory system 10 is used in an SSD, operation speed of a host (not shown) coupled to the memory system 10 may remarkably improve.

The memory controller 100 and the semiconductor memory device 200 may be integrated in a single semiconductor device such as a memory card. For example, the memory controller 100 and the semiconductor memory device 200 may be integrated in a single semiconductor device to configure a memory card such as a PC card of personal computer memory card international association (PCMCIA), a compact flash (CF) card, a smart media (SM) card, a memory stick, a multimedia card (MMC), a reduced-size multimedia card (RS-MMC), a micro-size version of MMC (MMCmicro), a secure digital (SD) card, a mini secure digital (miniSD) card, a micro secure digital (microSD) card, a secure digital high capacity (SDHC), and a universal flash storage (UFS).

For another example, the memory system 10 may be provided as one of various elements including an electronic device such as a computer, an ultra-mobile PC (UMPC), a workstation, a net-book computer, a personal digital assistant (PDA), a portable computer, a web tablet PC, a wireless phone, a mobile phone, a smart phone, an e-book reader, a portable multimedia player (PMP), a portable game device, a navigation device, a black box, a digital camera, a digital multimedia broadcasting (DMB) player, a 3-dimensional television, a smart television, a digital audio recorder, a digital audio player, a digital picture recorder, a digital picture player, a digital video recorder, a digital video player, a storage device of a data center, a device capable of receiving and transmitting information in a wireless environment, one of electronic devices of a home network, one of electronic devices of a computer network, one of electronic devices of a telematics network, a radio-frequency identification (RFID) device, or elements devices of a computing system.

Figure 2:
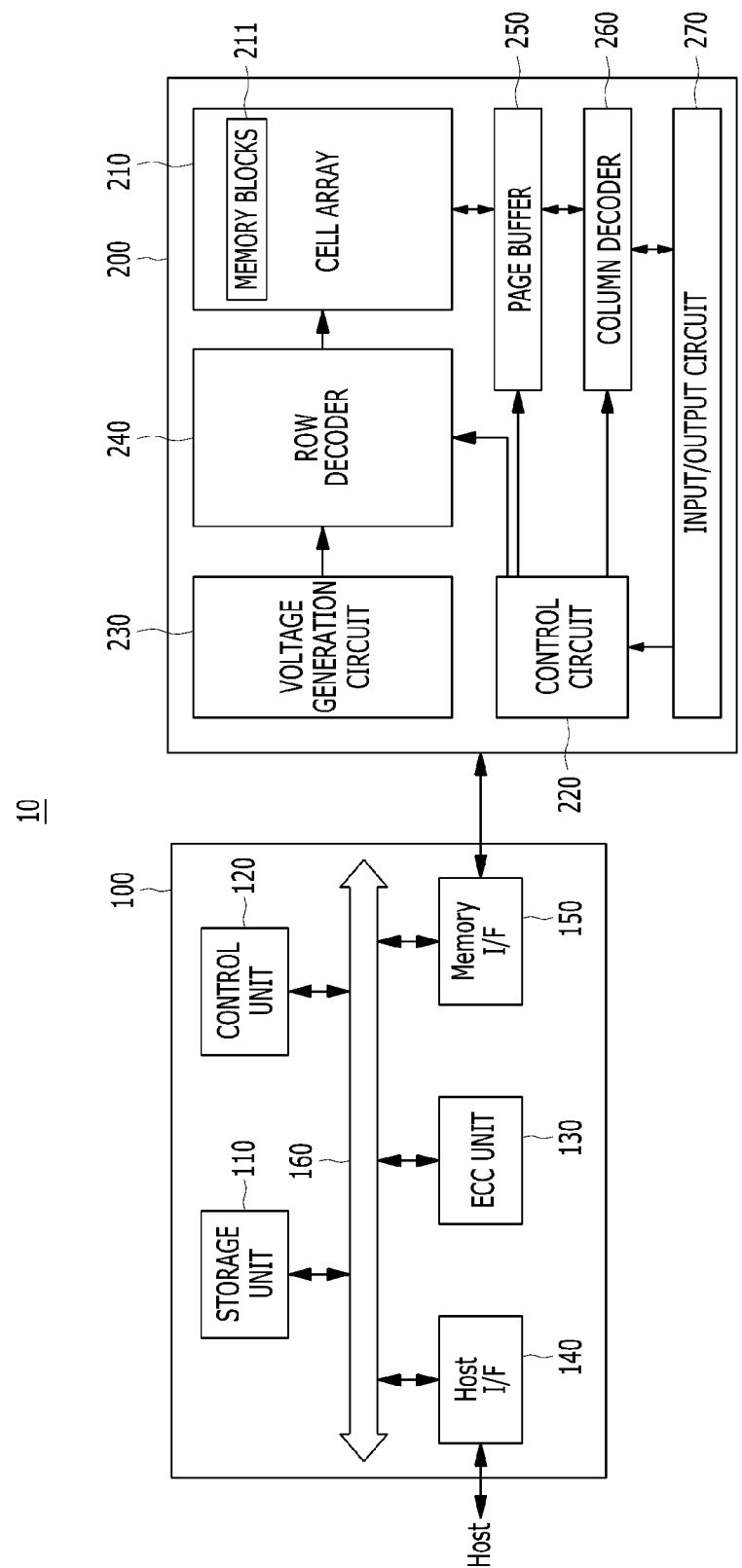
FIG. 2 is a block diagram illustrating a memory system in accordance with an embodiment of the present invention.

FIG. 2 is a detailed block diagram illustrating a memory system in accordance with an embodiment of the present invention. For example, the memory system of FIG. 2 may depict the memory system 10 shown in FIG. 1.

Referring to FIG. 2, the memory system 10 may include a memory controller 100 and a semiconductor memory device 200. The memory system 10 may operate in response to a request from a host device, and in particular, store data to be accessed by the host device.

The host device may be implemented with any one of various kinds of electronic devices. In some embodiments, the host device may include an electronic device such as a desktop computer, a workstation, a three-dimensional (3D) television, a smart television, a digital audio recorder, a digital audio player, a digital picture recorder, a digital picture player, a digital video recorder and a digital video player. In some embodiments, the host device may include a portable electronic device such as a mobile phone, a smart phone, an e-book, an MP3 player, a portable multimedia player (PMP), and a portable game player.

The memory device 200 may store data to be accessed by the host device.

The memory device 200 may be implemented with a volatile memory device such as a dynamic random access memory (DRAM) and a static random access memory (SRAM) or a non-volatile memory device such as a read only memory (ROM), a mask ROM (MROM), a programmable ROM (PROM), an erasable programmable ROM (EPROM), an electrically erasable programmable ROM (EEPROM), a ferroelectric random access memory (FRAM), a phase change RAM (PRAM), a magnetoresistive RAM (MRAM) and a resistive RAM (RRAM).

The controller 100 may control storage of data in the memory device 200. For example, the controller 100 may control the memory device 200 in response to a request from the host device. The controller 100 may provide the data read from the memory device 200, to the host device, and store the data provided from the host device into the memory device 200.

The controller 100 may include a storage unit 110, a control unit 120, the error correction code (ECC) unit 130, a host interface 140 and a memory interface 150, which are coupled through a bus 160.

The storage unit 110 may serve as a working memory of the memory system 10 and the controller 100, and store data for driving the memory system 10 and the controller 100. When the controller 100 controls operations of the memory device 200, the storage unit 110 may store data used by the controller 100 and the memory device 200 for such operations as read, write, program and erase operations.

The storage unit 110 may be implemented with a volatile memory. The storage unit 110 may be implemented with a static random access memory (SRAM) or a dynamic random access memory (DRAM). As described above, the storage unit 110 may store data used by the host device in the memory device 200 for the read and write operations. To store the data, the storage unit 110 may include a program memory, a data memory, a write buffer, a read buffer, a map buffer, and so forth.

The control unit 120 may control general operations of the memory system 10, and a write operation or a read operation for the memory device 200, in response to a write request or a read request from the host device. The control unit 120 may drive firmware, which is referred to as a flash translation layer (FTL), to control the general operations of the memory system 10. For example, the FTL may perform operations such as logical to physical (L2P) mapping, wear leveling, garbage collection, and bad block handling. The L2P mapping is known as logical block addressing (LBA).

The ECC unit 130 may detect and correct errors in the data read from the memory device 200 during the read operation. The ECC unit 130 may not correct error bits when the number of the error bits is greater than or equal to a threshold number of correctable error bits, and may output an error correction fail signal indicating failure in correcting the error bits.

In some embodiments, the ECC unit 130 may perform an error correction operation based on a coded modulation such as a low density parity check (LDPC) code, a Bose-Chaudhuri-Hocquenghem (BCH) code, a turbo code, a turbo product code (TPC), a Reed-Solomon (RS) code, a convolution code, a recursive systematic code (RSC), a trellis-coded modulation (TCM), a Block coded modulation (BCM), and so on. The ECC unit 130 may include all circuits, systems or devices for the error correction operation.

The host interface 140 may communicate with the host device through one or more of various interface protocols such as a universal serial bus (USB), a multi-media card (MMC), a peripheral component interconnect express (PCI-E), a small computer system interface (SCSI), a serial-attached SCSI (SAS), a serial advanced technology attachment (SATA), a parallel advanced technology attachment (PATA), an enhanced small disk interface (ESDI), and an integrated drive electronics (IDE).

The memory interface 150 may provide an interface between the controller 100 and the memory device 200 to allow the controller 100 to control the memory device 200 in response to a request from the host device. The memory interface 150 may generate control signals for the memory device 200 and process data under the control of the CPU 120. When the memory device 200 is a flash memory such as a NAND flash memory, the memory interface 150 may generate control signals for the memory and process data under the control of the CPU 120.

The memory device 200 may include a memory cell array 210, a control circuit 220, a voltage generation circuit 230, a row decoder 240, a page buffer 250, a column decoder 260, and an input/output circuit 270. The memory cell array 210 may include a plurality of memory blocks 211 and may store data therein. The voltage generation circuit 230, the row decoder 240, the page buffer 250, the column decoder 260 and the input/output circuit 270 form a peripheral circuit for the memory cell array 210. The peripheral circuit may perform a program, read, or erase operation of the memory cell array 210. The control circuit 220 may control the peripheral circuit.

The voltage generation circuit 230 may generate operation voltages having various levels. For example, in an erase operation, the voltage generation circuit 230 may generate operation voltages having various levels such as an erase voltage and a pass voltage.

The row decoder 240 may be connected to the voltage generation circuit 230, and the plurality of memory blocks 211. The row decoder 240 may select at least one memory block among the plurality of memory blocks 211 in response to a row address RADD generated by the control circuit 220, and transmit operation voltages supplied from the voltage generation circuit 230 to the selected memory blocks among the plurality of memory blocks 211.

The page buffer 250 is connected to the memory cell array 210 through bit lines BL (not shown). The page buffer 250 may precharge the bit lines BL with a positive voltage, transmit/receive data to/from a selected memory block in program and read operations, or temporarily store transmitted data, in response to a page buffer control signal generated by the control circuit 220.

The column decoder 260 may transmit/receive data to/from the page buffer 250 or transmit/receive data to/from the input/output circuit 270.

The input/output circuit 270 may transmit, to the control circuit 220, a command and an address, transmitted from an external device (e.g., the memory controller 100), transmit data from the external device to the column decoder 260, or output data from the column decoder 260 to the external device, through the input/output circuit 270.

The control circuit 220 may control the peripheral circuit in response to the command and the address.

Figure 3:
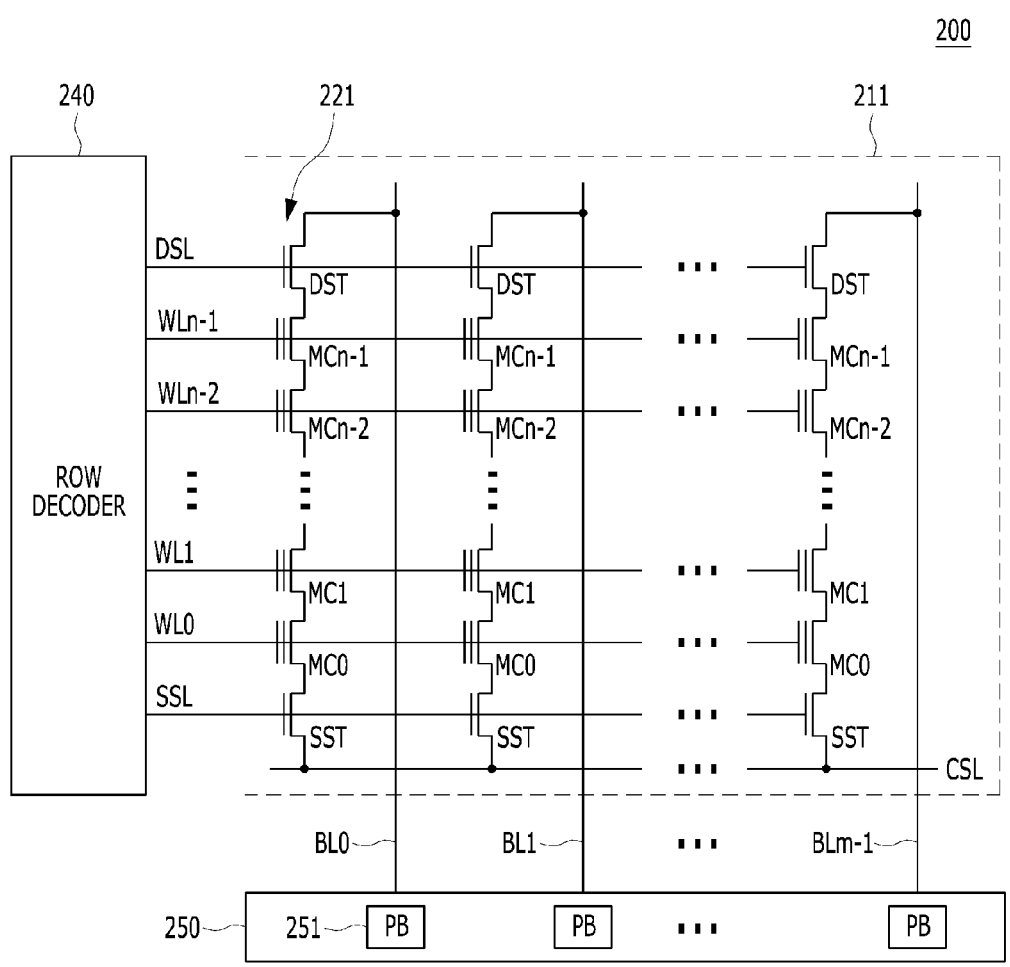
FIG. 3 is a circuit diagram illustrating a memory block of a memory device in accordance with an embodiment of the present invention.

FIG. 3 is a circuit diagram illustrating a memory block of a semiconductor memory device in accordance with an embodiment of the present invention. For example, a memory block of FIG. 3 may be the memory blocks 211 of the memory cell array 200 shown in FIG. 2.

Referring to FIG. 3, the memory blocks 211 may include a plurality of cell strings 221 coupled to bit lines BL0 to BLm−1, respectively. The cell string of each column may include one or more drain selection transistors DST and one or more source selection transistors SST. A plurality of memory cells or memory cell transistors may be serially coupled between the selection transistors DST and SST. Each of the memory cells MC0 to MCn−1 may be formed of a multi-level cell (MLC) storing data information of multiple bits in each cell. The cell strings 221 may be electrically coupled to the corresponding bit lines BL0 to BLm−1, respectively.

In some embodiments, the memory blocks 211 may include a NAND-type flash memory cell. However, the memory blocks 211 are not limited to the NAND flash memory, but may include NOR-type flash memory, hybrid flash memory in which two or more types of memory cells are combined, and one-NAND flash memory in which a controller is embedded inside a memory chip.

Figure 4:
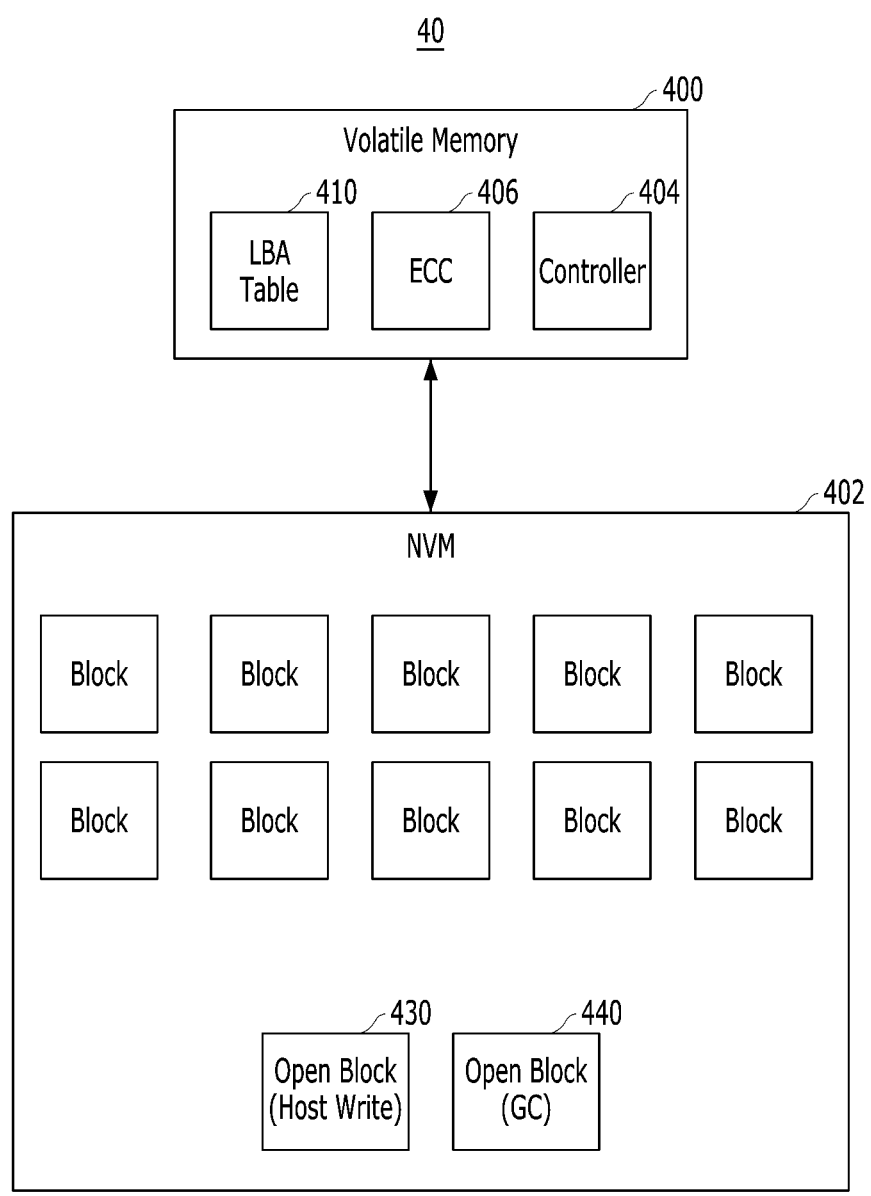
FIG. 4 is a diagram of an example memory system according to aspects of the invention.

At FIG. 4, a general example of a memory system 40 is shown. The memory system 40 may include a volatile memory 400 (e.g., a DRAM) and a non-volatile memory (NVM) 402 (e.g., NAND) in communication with the volatile memory 400. The volatile memory 400 may include a controller 404, such as the controllers described herein, an error correcting code module 406, and a logical bit address LBA table 410 for mapping physical to logical addresses of bits. The NVM 402 may include a plurality of memory blocks (and/or a plurality of super memory blocks), as well as an open block for host writes 430 and an open block for garbage collection (GC) 440. The memory system 40 shows a general memory system, and additional/alternative components that may be utilized with memory systems to effectuate the invention disclosed herein will be understood to those of skill in the art.

As referred to herein, terms such as "NAND" or "NVM" may refer to non-volatile memories such as flash memories which may implement error correcting code processes. Further, "DRAM" may refer to volatile memories which may include components such as controllers and ECC modules.

Since data written on a NAND is subject to read errors (e.g., bit flips when read), the data written on the NAND may be protected by error correcting codes "ECCs". However, ECC decoding may still fail in some cases, such as cases due to NAND defects or other interferences.

To recover data after an ECC error, XOR-based recovery schemes are commonly used. In general with an XOR-based scheme, the bitwise XOR of data pages from different die-plane pairs may be calculated and saved in a page called a "parity page", which together with the data pages may be referred to as a "stripe".

An example XOR array configuration 50 is shown in FIG. 5. The configuration 50 includes a memory storage with N dies (e.g., such that the last die is numbered as N−1). Each die may include two planes (e.g., plane 0 and plane 1). Each stripe 500, 502, and 504 includes the same physical page from each of the die-plane pairs. Although only three stripes are depicted, this is for simplicity, and those of skill in the art will understand additional numbers of stripes may be present in XOR configurations. Data pages are labeled as "D" and parity pages are labeled as "P". As depicted, the page corresponding to the final plane on the last die (Die N−1) includes the parity pages.

In the XOR configuration 50 shown, if any of the data pages in a stripe has an ECC error, the data in the page may be recovered by performing an XOR of all other pages in the same stripe including the parity page. For example, as shown in the configuration 60 of FIG. 6, if stripe 500 has an error at the data page on plane 1 of Die 1 (e.g., represented by "ER"), an XOR may be taken on each of the other data pages and the parity page of stripe 500 to recover the error "ER". Thus, the configurations 50 and 60 may be capable of recovering single-plane failures.

However, if more than one page in the same stripe have ECC errors, configurations 50 and 60 are not capable of recovering the errors. Multiple errors in a single stripe or errors on both planes of the same die may be a common occurrence in NAND flash, which may be caused by, for example, programming problems, since the planes of a die are usually programmed together.

Alternative configurations are thus necessary to recover dual-plane (or multi-plane) errors. One example of a solution is to have two parity pages per stripe, but this solution increases data redundancy and therefore reduces the memory's over provisioning (OP) specification. This increases write amplification (WA) and may drastically lower the memory's random write performance, thus rendering the two parity pages per stripe solution non-viable.

Disclosed herein are systems, methods, processes and devices utilizing an XOR array configuration with low amount of data redundancy (e.g., amounts of data redundancy similar to that of configuration 50 of FIG. 5) but with the ability to recover data in dual-plane (or multi-plane) ECC errors, as well as single-plane NAND failures (e.g., failures such as those shown in configuration 60 of FIG. 6).

Figure 7A:
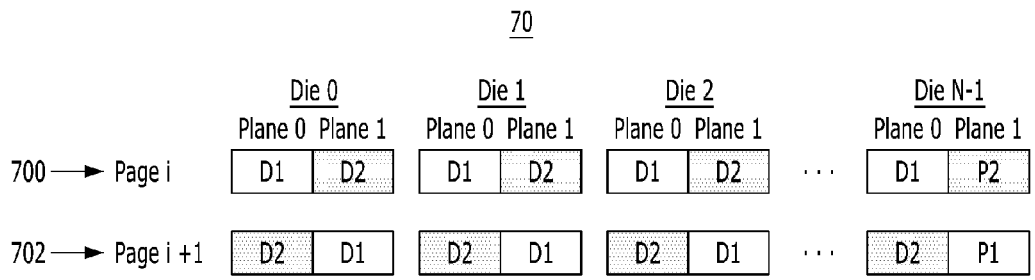
FIG. 7A is a diagram of an example XOR configuration in accordance with aspects of the invention.

An example XOR array configuration 70 is shown in FIG. 7A. The configuration 70 includes multiple dies, with each die having multiple planes, and two pages 700 and 702. The data pages and the parity pages are cyclically interleaved, thereby making two cyclically interleaved stripes. In other words, the first stripe includes data pages D1 and parity page P1, while the second stripe include data pages D2 and parity page P2. For each stripe, data pages are limited to one data page per plane, such that dual-plane (or multi-plane) errors may be corrected. The parity page P1 stores an XOR parity taken over all the data pages D1 and the parity page P2 stores an XOR parity taken over all the data pages D2. Thus, all pages on the same stripe are on different die/plane/page combinations.

Figure 7B:
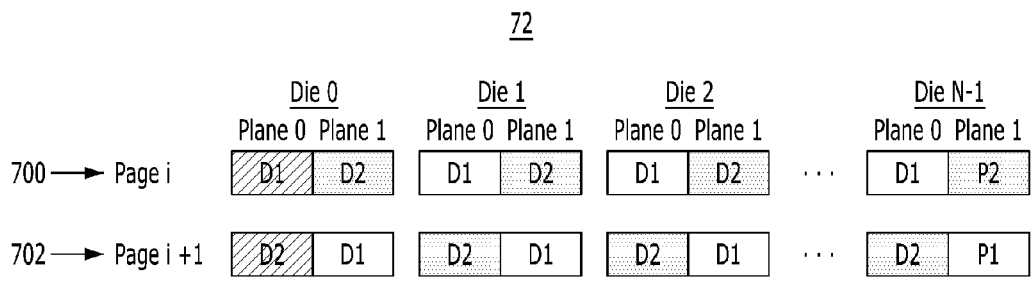
FIGS. 7B and 7C are diagrams of example XOR configurations with errors according to aspects of the invention.

FIG. 7B shows a configuration 72 with a single-plane failure. The failures are shown as D1 of Die 0/Plane 0 and D2 of Die 0/Plane 0. The D1 error and the D2 error in the failed die-plane pair belong to different interleaved XOR stripes, and thus, the errors can be recovered (e.g., by an ECC unit) by running an XOR recovery on each stripe (e.g., using parity P1 to recover the D1 error and using the parity P2 to recover the D2 error).

Figure 7C:
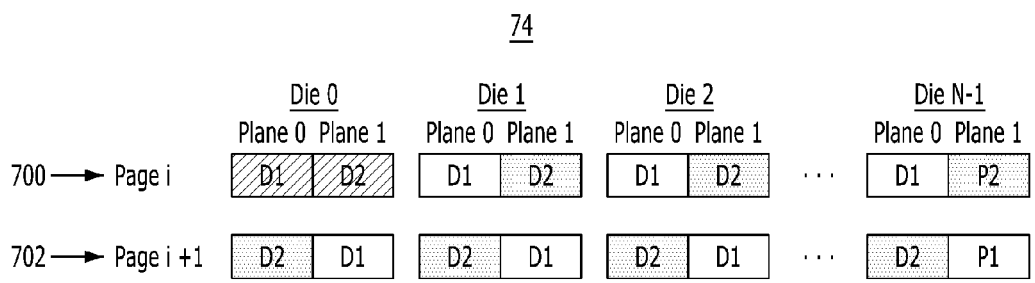

FIG. 7C shows a configuration 74 with a dual-plane read error. In the configuration, page 700 includes a dual-plane error in that both Plane 0 and Plane 1 of Die 0 have errors. The error in D1 and D2 are on the same page and thus, would not ordinarily be able to be corrected by the XOR configurations shown in configurations 50 and 60. However, since the stripes are cyclically interleaved, the error on plane 0 (D1) does not occur on the same stripe as the error on plane 1 (D2). Since the errors are on different interleaved stripes, they can be recovered (e.g., by an ECC unit), using the XOR parity P1 for the D1 error and the XOR parity P2 for the D2 error.

Additional configurations are shown in FIGS. 8A, 8B, and 8C. The same principle of stripe interleaving can be generalized to the case that each die has more than two planes. In the configuration 80, each die has four planes (PL0-PL3). Four physical pages 800, 802, 804, and 806 make a stripe group. The stripe group includes four interleaved stripes. The first stripe includes data pages D1 corresponding to the first stripe and the first parity page P1, and so on such that the fourth stripe includes data pages D4 corresponding to the fourth stripe and the fourth parity page P4, where each parity page stores a corresponding XOR parity of the cyclically interleaved stripe. Each stripe includes data pages that are limited to one data page per plane.

Single plane and multi-plane errors can be corrected (e.g., by an ECC unit) using the configuration 80. For example, FIG. 8B shows an example of a multi-plane error. Page 800 includes errors on Die 0 at PL0, PL1, and PL3. However, the error at PL0 is on the D1 stripe, the error at PL1 is on the D2 stripe, and the error at PL3 is on the D4 stripe. Therefore, the errors can be recovered with their corresponding XOR parities stored at P1, P2 and P4 respectively.

Similarly, FIG. 8C shows an example of a single plane error. Pages 800, 802, and 804 include errors. The errors occur in Die 0 at plane PL0. However, the page 800 error is on the D1 stripe, the page 802 error is on the D4 stripe, and the 804 error is on the D3 stripe. Thus, the errors can be recovered with their corresponding XOR parities stored at P1, P4, and P3 respectively.

Figure 9:
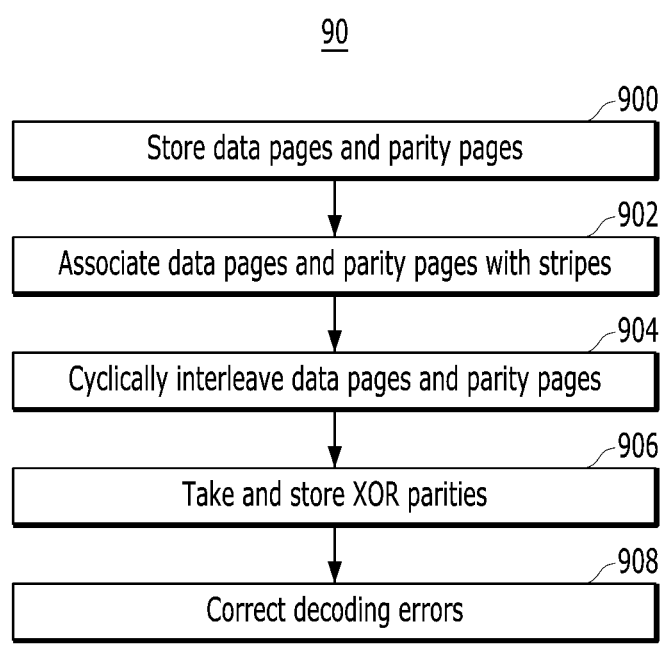
FIG. 9 is a flowchart of steps in a method for correcting errors in accordance with aspects of the invention.

FIG. 9 is a flowchart 90 of example steps for arranging a configuration of an XOR array and correcting errors. The steps in flowchart 90 are shown in the order presented for ease of description, and those of skill in the art will understand other suitable orders for conducting the steps in flowchart 90 in order to effectuate the disclosed invention. At step 900, data pages and parity pages are stored. The data pages and parity pages may be stored along a memory storage that includes a plurality of dies, where each die includes multiple planes.

At step 902, the data pages and parity pages are associated with stripes. In some examples, the stripes correspond to the horizontally corresponding data. In other examples, the stripes are arranged differently. The number of stripes may correspond to the number of pages in the memory storage, or an alternative number that may be necessitated by alternative memory configurations.

At step 904, the data pages and parity pages are cyclically interleaved. The data pages and parity pages may be cyclically interleaved in order to construct cyclically interleaved data stripes, such as those described above. In some examples, the pages are cyclically interleaved such that each stripe is limited to one data page per plane.

At step 906, XOR parities are taken and stored. The XOR parities may be taken over the data pages. In some examples, such as when the data pages are cyclically interleaved, the XOR parities may be taken over the cyclically interleaved stripes and stored at locations corresponding to the cyclical interleaving.

At step 908, decoding errors are corrected. For example, an ECC unit may be configured to decode errors. When reads are carried out on the memory systems and devices, read errors may occur (e.g., in the form of bit flips). The errors may be single errors or multiple errors. When multiple errors occur, the errors may be single plane errors or multi-plane errors. These errors may be corrected (e.g., by an ECC unit) when using the cyclically interleaved stripe configurations disclosed and described above.

Although the foregoing embodiments have been described in some detail for purposes of clarity of understanding, the invention is not limited to the details provided. There are many alternative ways of implementing the invention. The disclosed embodiments are illustrative and not restrictive.

What is claimed is:

1. A memory system, comprising:
    a host; and
    a memory storage connected with the host and including at least two memory dies, each of the at least two memory dies includes at least two planes, wherein the memory storage is constructed with stripes, the stripes include at least a first stripe and a second stripe,
    the first stripe including data pages corresponding to the first stripe and a respective first parity page storing a first XOR parity of the first stripe, and
    the second stripe including data pages corresponding to the second stripe and a respective second parity page storing a second XOR parity of the second stripe; and
    a controller coupled with the memory storage and configured to
    store the data pages and respective parity pages over a plurality of memory dies, and
    cyclically interleave the data pages corresponding to the first stripe and the data pages corresponding to the second stripe, wherein the same data pages on different planes in each of the memory dies are constructed into different stripes across the planes, and the number of stripes in each stripe group equals to the number of the planes in each of the memory dies, wherein the stripe group includes a number of stripes cyclically interleaved across all the planes in each of the memory dies.

2. The memory system of claim 1, wherein the data pages are cyclically interleaved such that the first XOR parity is taken over a first group of data pages limited to one data page per plane.

3. The memory system of claim 2, wherein the data pages are cyclically interleaved such that the second XOR parity is taken over a second group of data pages limited to one data page per plane.

4. The memory system of claim 1, further comprising an error correcting code (ECC) unit configured to correct multiple errors in more than one plane.

5. The memory system of claim 4, wherein the ECC unit is further configured to correct multiple errors in a single plane.

6. The memory system of claim 1, wherein each data page corresponding to the first stripe and the first parity page are stored on different planes.

7. The memory system of claim 6, wherein each data page corresponding to the second stripe and the second parity page are stored on different planes.

8. A method of operating a memory system including a memory storage and a controller, comprising:
    storing data pages and respective parity pages over a plurality of memory dies of the memory storage, wherein the memory storage includes at least two memory dies, each of the at least two memory dies includes at least two planes, wherein the memory storage is constructed with stripes, the stripes include at least a first stripe and a second stripe;
    associating data pages and a first parity page with the first stripe of the memory storage;
    associating data pages and a second parity page with the second stripe of the memory storage;
    cyclically interleaving the first parity page and data pages associated with the first stripe with the second parity page and data pages associated with the second stripe, wherein the same data pages on different planes in each of the memory dies are constructed into different stripes across the planes, and the number of stripes in each stripe group equals to the number of the planes in each of the memory dies, wherein the stripe group includes a number of stripes cyclically interleaved across all the planes in each of the memory dies;
    taking a first XOR parity over the first stripe and storing the first XOR parity in the first parity page; and
    taking a second XOR parity over the second stripe and storing the second XOR parity in the second parity page.

9. The method of claim 8, wherein the cyclically interleaving step is performed such that the first parity page and data pages associated with the first stripe are limited to one page per plane.

10. The method of claim 9, wherein the cyclically interleaving step is performed such that the second parity page and data pages associated with the second stripe are limited to one page per plane.

11. The method of claim 8, wherein when multiple errors occur in more than one plane, further comprising correcting, with an error correcting code (ECC) unit, the multiple errors with the first XOR parity and the second XOR parity.

12. The method of claim 8, further comprising storing each data page corresponding to the first stripe and the first parity page on different planes.

13. The method of claim 12, further comprising storing each data page corresponding to the second stripe and the second parity page on different planes.

14. A memory device, comprising:
    a memory storage including at least two memory dies, each of the at least two memory dies includes at least two planes, wherein the memory storage is constructed with stripes, the stripes include at least a first stripe and a second stripe,
    the first stripe including data pages corresponding to the first stripe and a respective first parity page configured to store a first XOR parity of the first stripe, and
    the second stripe including data pages corresponding to the second stripe and a respective second parity page configured to store a second XOR parity of the second stripe; and a controller coupled with the memory storage and configured to store the data pages and respective parity pages being stored over a plurality of memory dies; and cyclically interleave the data pages corresponding to the first stripe and the data pages corresponding to the second stripe, wherein the same data pages on different planes in each of the memory dies are constructed into different stripes across the planes, and the number of stripes in each stripe group equals to the number of the planes in each of the memory dies, wherein the stripe group includes a number of stripes cyclically interleaved across all the planes in each of the memory dies.

15. The memory device of claim 14, wherein the data pages are cyclically interleaved such that the first XOR parity is taken over a first group of data pages limited to one data page per plane.

16. The memory device of claim 15, wherein the data pages are cyclically interleaved such that the second XOR parity is taken over a second group of data pages limited to one data page per plane.

17. The memory device of claim 14, further comprising an error correcting code (ECC) unit configured to correct multiple errors in more than one plane.

18. The memory device of claim 17, wherein the ECC unit is further configured to correct multiple errors in a single plane.

19. The memory device of claim 14, wherein each data page corresponding to the first stripe and the first parity page are stored on different planes.

20. The memory device of claim 19, wherein each data page corresponding to the second stripe and the second parity page are stored on different planes.

* * * * *